(12) United States Patent
Shirakawa et al.

(10) Patent No.: US 7,839,621 B2
(45) Date of Patent: Nov. 23, 2010

(54) ELECTRONIC COMPONENT, MOUNTED STRUCTURE, AND INVERTER DEVICE THEREWITH

(75) Inventors: Yukihiko Shirakawa, Tokyo (JP); Iwao Miura, Tokyo (JP)

(73) Assignee: TDK Corporation, Tokyo (JP)

( * ) Notice: Subject to any disclaimer, the term of this patent is extended or adjusted under 35 U.S.C. 154(b) by 373 days.

(21) Appl. No.: 12/039,284

(22) Filed: Feb. 28, 2008

(65) Prior Publication Data

US 2008/0225461 A1   Sep. 18, 2008

(30) Foreign Application Priority Data

Mar. 12, 2007   (JP) .............................. 2007-062401

(51) Int. Cl.
H01G 4/228   (2006.01)
H01G 4/248   (2006.01)
H01G 4/06   (2006.01)
(52) U.S. Cl. ..................... 361/306.1; 361/310; 361/311
(58) Field of Classification Search ............. 361/306.1, 361/306.2, 311, 310, 321.1
See application file for complete search history.

(56) References Cited

U.S. PATENT DOCUMENTS

| | | | | |
|---|---|---|---|---|
| 3,086,149 A | * | 4/1963 | Baron | ..................... 361/301.3 |
| 3,924,164 A | * | 12/1975 | Lindberg | .................. 361/321.1 |
| 4,748,537 A | * | 5/1988 | Hernandez et al. | ........ 361/306.2 |
| 4,788,625 A | * | 11/1988 | Maijers | .................... 361/306.1 |
| 4,827,634 A | * | 5/1989 | Tanabe | ..................... 361/306.1 |
| 5,963,423 A | * | 10/1999 | Ikeda | .......................... 361/690 |
| 5,978,205 A | * | 11/1999 | Aoyagi et al. | ............... 361/303 |
| 6,310,758 B1 | * | 10/2001 | Niikura | ....................... 361/309 |

FOREIGN PATENT DOCUMENTS

| | | | |
|---|---|---|---|
| CN | 1300133 A | | 6/2001 |
| JP | A 2-92916 | | 7/1990 |
| JP | 04146610 A | * | 5/1992 |
| JP | A-5-55071 | | 3/1993 |
| JP | A-2001-143959 | | 5/2001 |
| JP | A-2002-252140 | | 9/2002 |
| JP | 2003017641 A | * | 1/2003 |

* cited by examiner

*Primary Examiner*—Eric Thomas
*Assistant Examiner*—David M Sinclair
(74) *Attorney, Agent, or Firm*—Oliff & Berridge, PLC

(57) ABSTRACT

A surface mount type electronic component has a dielectric element body, electrodes, lead conductors, and lead wires. The dielectric element body has principal faces and side faces. One electrode is formed on one principal face, the other electrode is formed on the other principal face, and the electrodes face each other. A first portion of one lead conductor is laid on one side face. A first portion of the other lead conductor is laid on another side face. First portions of the lead wires are connected to the corresponding first portions of the lead conductors.

2 Claims, 9 Drawing Sheets

Fig.6
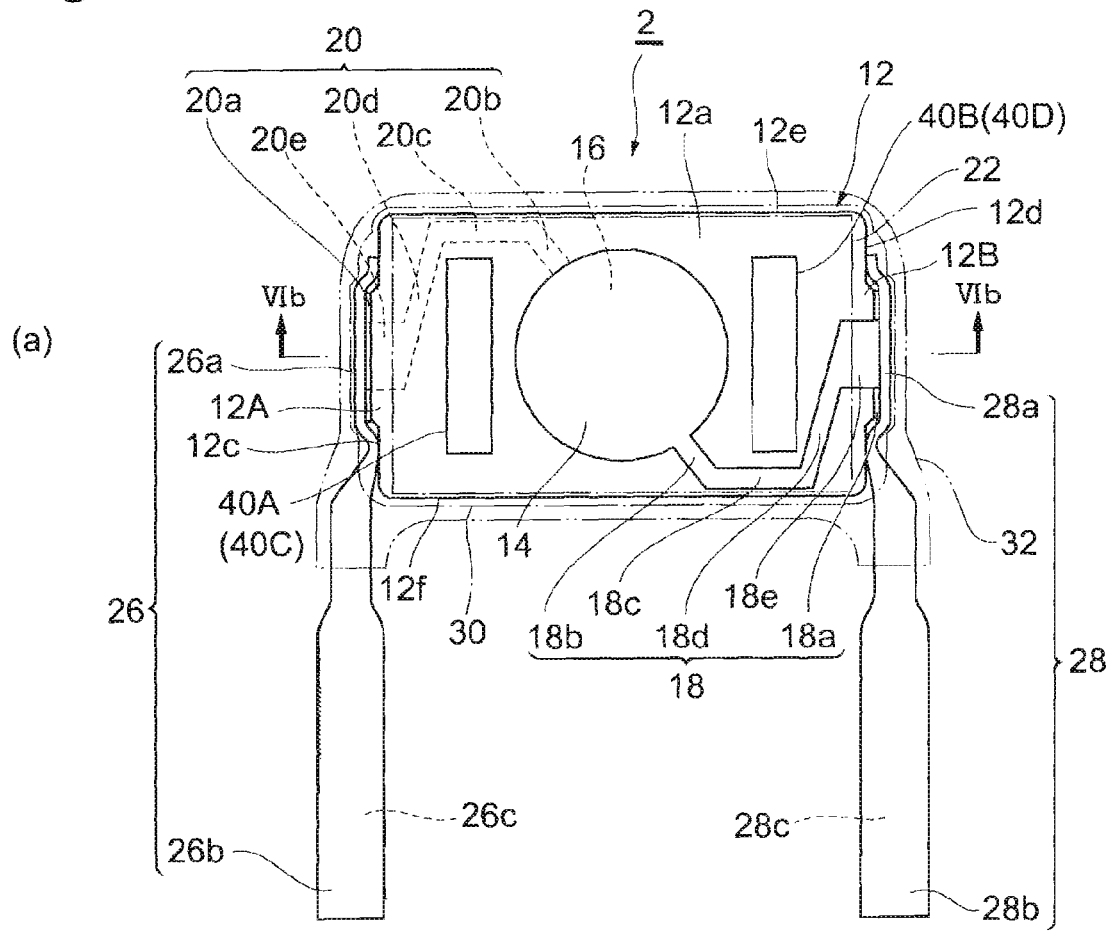
(a)
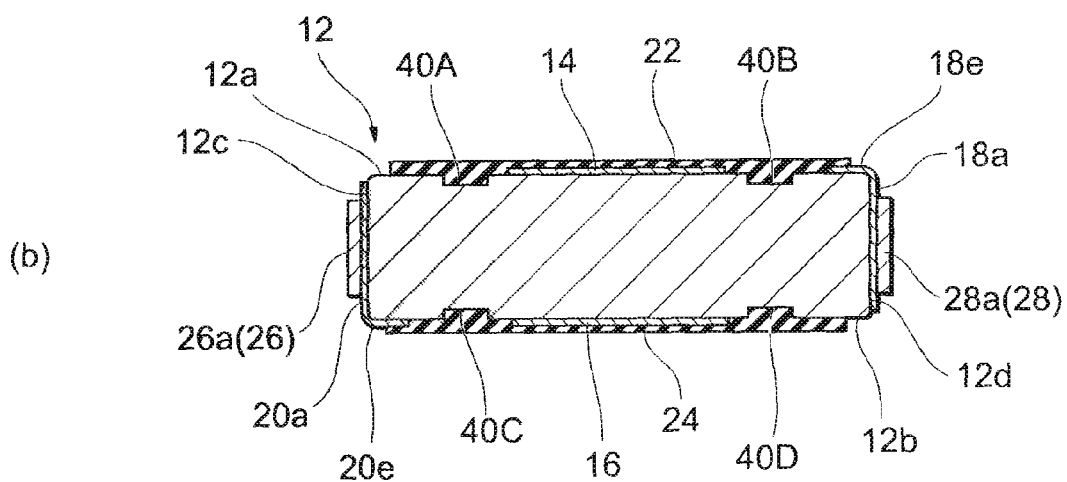
(b)

Fig.8
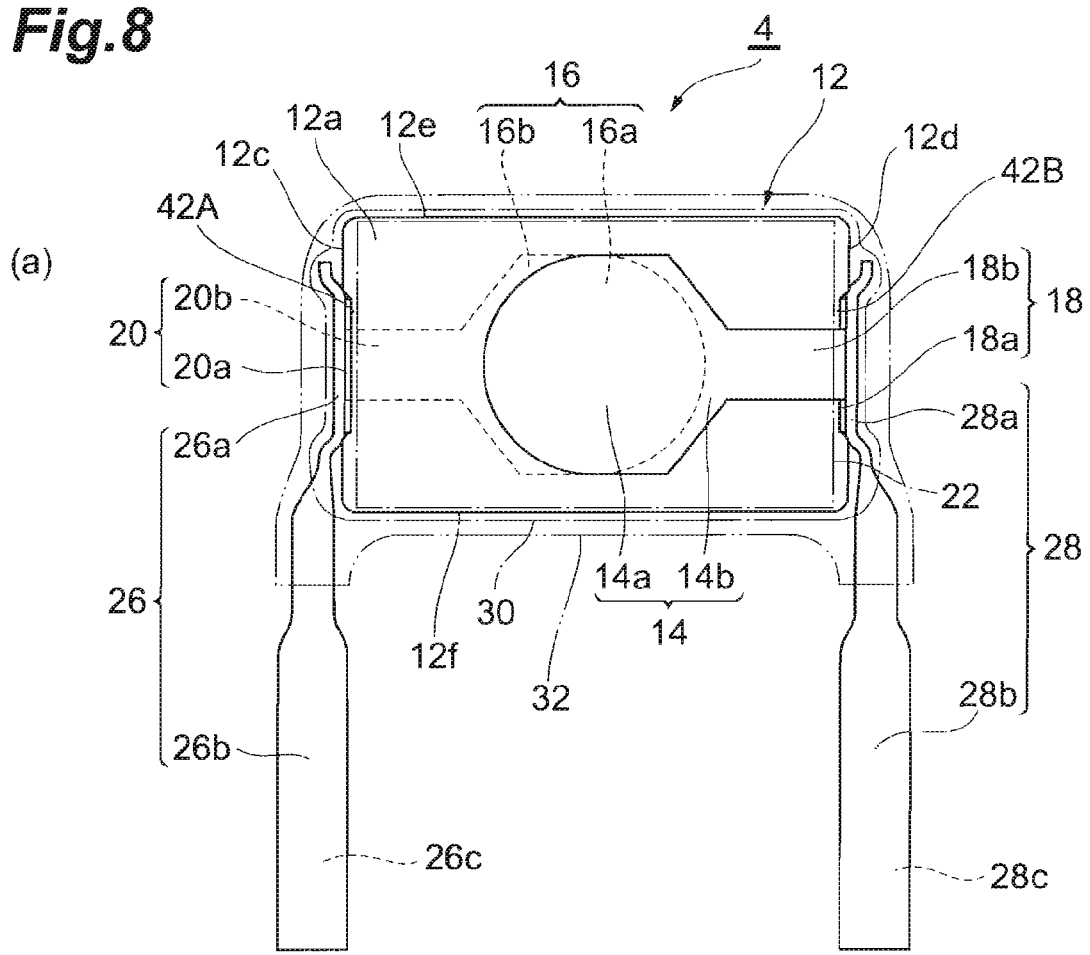
(a)
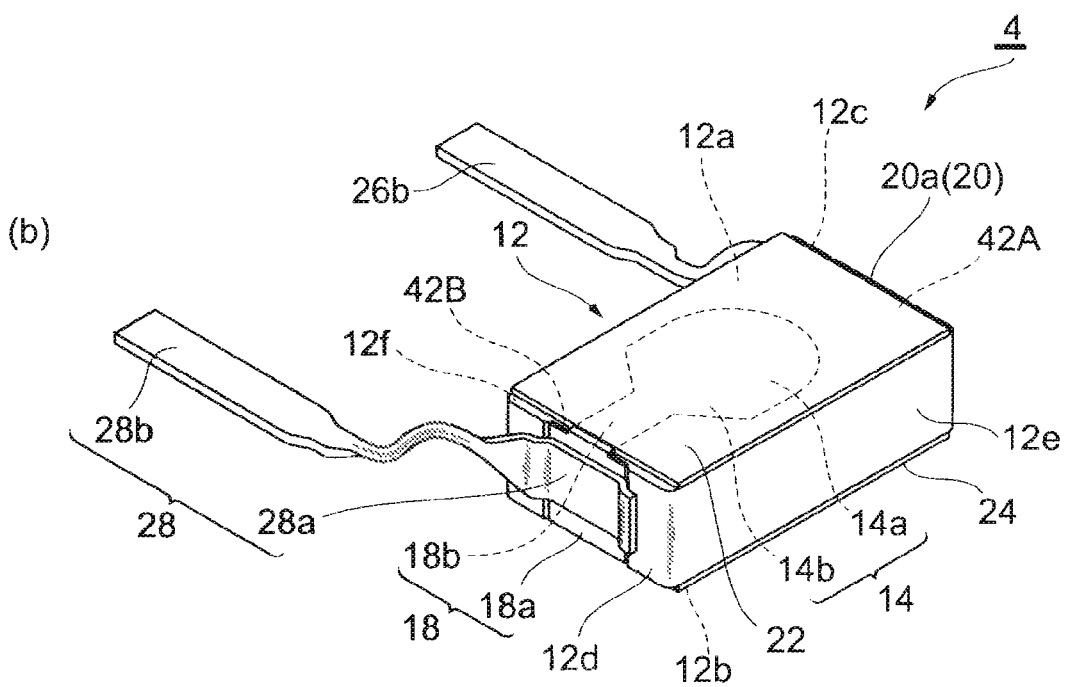
(b)

Fig.9
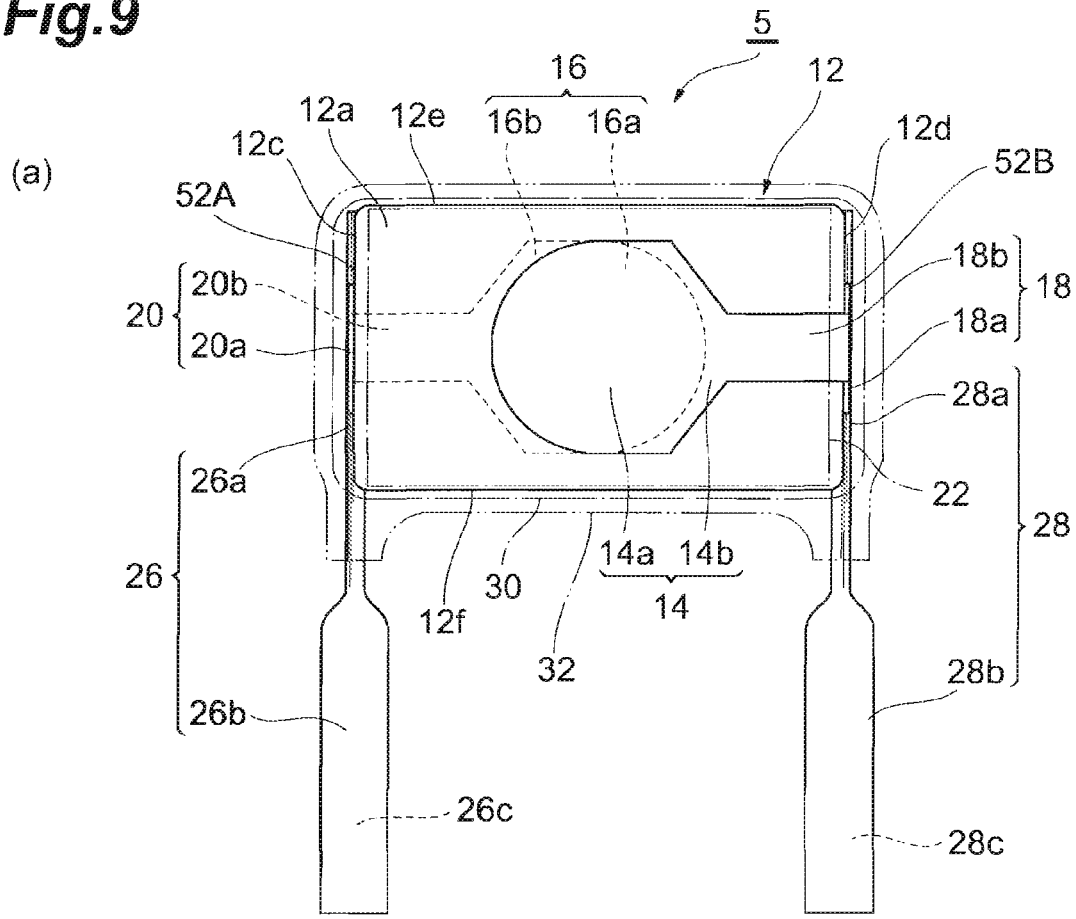
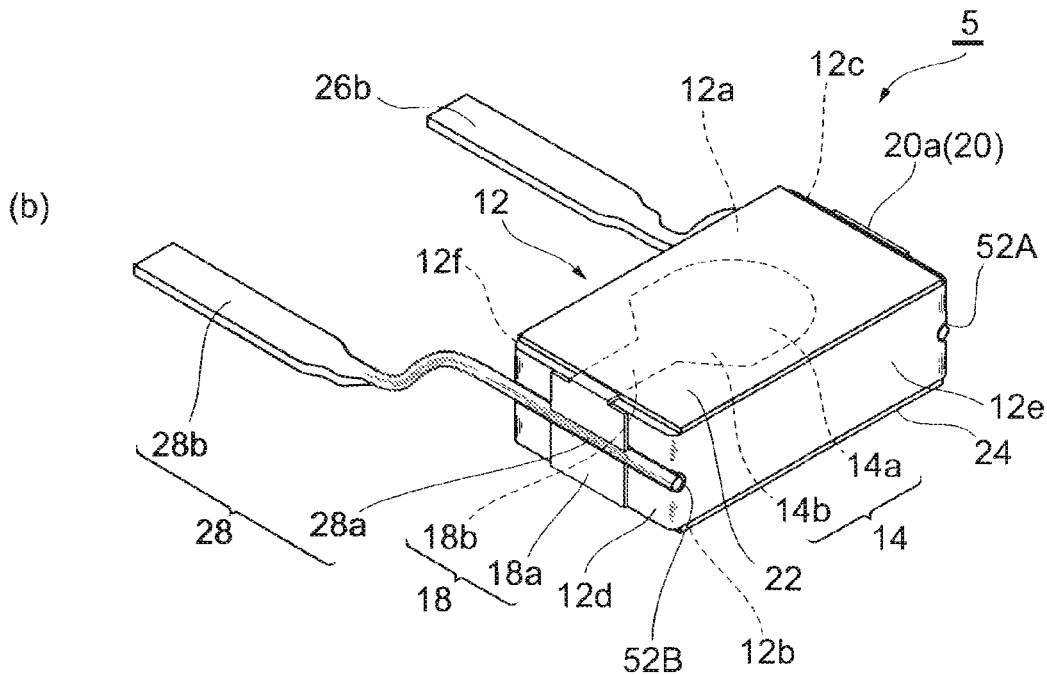

ELECTRONIC COMPONENT, MOUNTED STRUCTURE, AND INVERTER DEVICE THEREWITH

BACKGROUND OF THE INVENTION

1. Field of the Invention

The present invention relates to an electronic component, a mounted structure, and an inverter device therewith.

2. Related Background Art

A conventionally known capacitor is constructed with an element body of a nearly circular cylinder shape having a pair of principal faces facing each other, a pair of electrodes formed on the respective principal faces of the element body, and a pair of lead wires connected to the respective electrodes (e.g., cf. Japanese Utility Model Application Laid-open No. 2-92916).

SUMMARY OF THE INVENTION

Presently, liquid crystal panels are used in a wide range of application, e.g., in liquid crystal displays, liquid crystal televisions, and so on. The liquid crystal panels are rapidly becoming larger and larger in these years and in conjunction therewith, the number of cold-cathode tubes used as backlights of the liquid crystal panel is also increasing. These cold-cathode tubes are connected to respective inverter devices and lighting-up and lighting-off operations thereof are controlled by the inverter devices.

A cold-cathode tube generally demonstrates a negative current-voltage characteristic. Therefore, some types of inverter devices are equipped with a capacitor (ballast capacitor) on a circuit board constituting the inverter devices in order to regulate the negative characteristic of the cold-cathode tube. It is, however, the present status that, for example, when the conventional capacitor as described in the foregoing application Laid-open No. 2-92916 is mounted onto the circuit board, a man manually performs, with each capacitor, a step of putting a distal end of each lead wire of the capacitor on a pad on the circuit board and soldering the distal end of the lead wire to the circuit board, which posed a problem of very large effort, time, cost, etc. for mounting of the capacitor. For implementing easier mounting, there are desires for a surface mount type capacitor permitting automatization of mounting.

In the conventional capacitor as described above, however, the element body was of the nearly circular cylinder shape, and the lead wires were connected to the electrodes formed on the principal faces of the element body. For this reason, no flat face was present in the conventional capacitor and thus, when the conventional capacitor was attempted to be surface-mounted, the capacitor was so unsteady as to cause positional deviation during the mounting step thereof on the circuit board, resulting in failure in mounting the capacitor at a desired position on the circuit board. In addition, since the conventional capacitor had no flat face, when it was attempted to be surface-mounted using a mounting apparatus for surface mounting of electronic component, it was hard for a suction nozzle of the mounting apparatus to suck the capacitor and it was difficult to automatize the mounting.

An object of the present invention is therefore to provide an electronic component permitting easy surface mounting onto a circuit board, a mounted structure, and an inverter device therewith.

An electronic component according to the present invention comprises: an element body having a first principal face and a second principal face facing each other, and a first side face and a second side face extending so as to couple the first principal face and the second principal face to each other, and facing each other; a first electrode laid on the first principal face of the element body; a second electrode laid on the second principal face of the element body and facing the first electrode; a first lead conductor electrically connected to the first electrode; a second lead conductor electrically connected to the second electrode; a first lead wire electrically connected to the first lead conductor; and a second lead wire electrically connected to the second lead conductor; wherein the first lead conductor has a first portion laid on the first side face, and the first portion is connected to the first lead wire to be electrically connected to the first lead wire; and wherein the second lead conductor has a first portion laid on the second side face, and the first portion is connected to the second lead wire to be electrically connected to the second lead wire.

In the electronic component according to the present invention, the first lead wire is connected to the first portion of the first lead conductor laid on the first side face and the second lead wire is connected to the first portion of the second lead conductor laid on the second side face. Therefore, the first and second lead wires are not present on the first and second principal face sides of the element body, and a region corresponding to the first principal face and a region corresponding to the second principal face are relatively flat in the exterior of the electronic component. As a result, the electronic component can be surface-mounted by means of the conventional electronic component mounting apparatus, which facilitates the surface mounting of the electronic component onto a circuit board.

Preferably, the electronic component further comprises an electrically insulating armor laid so as to cover at least the element body, the first electrode, and the second electrode; wherein the first lead wire has a first portion connected to the first portion of the first lead conductor, and a second portion extending from the first portion; wherein the second lead wire has a first portion connected to the first portion of the second lead conductor, and a second portion extending from the first portion; and wherein at least part of the respective second portions of the first lead wire and the second lead wire are located on a virtual plane including an exterior surface of the armor located on the first principal face side. In this case, when the electronic component is mounted on a circuit board, the exterior of the armor and at least part of the respective second portions of the first lead wire and the second lead wire come into contact with the circuit board. As a result, no unsteadiness occurs during mounting the electronic component onto the circuit board, which permits the electronic component to be located at any desired position on the circuit board and which enables secure surface mounting.

Preferably, the at least part of the respective second portions of the first lead wire and the second lead wire are of a flat shape. In this case, the contact area increases between the at least part of the respective second portions of the first lead wire and the second lead wire and the circuit board when compared with a configuration wherein the at least part of the respective second portions of the first lead wire and the second lead wire are not flat. As a result, it becomes feasible to increase the bond strength of first lead wire and the second lead wire to the circuit board when the at least part of the respective second portions of the first lead wire and the second lead wire are soldered to corresponding signal electrodes on the circuit board.

Preferably, the first lead wire has a first portion connected to the first portion of the first lead conductor, and a second portion extending from the first portion; the second lead wire has a first portion connected to the first portion of the second lead conductor, and a second portion extending from the first portion; and the respective second portions of the first lead wire and the second lead wire are bent toward the respective first portions of the first lead wire and the second lead wire. In this case, the mounting area of the electronic component becomes smaller. As a result, it becomes feasible to increase the mounting density of various electronic components including the electronic component of the present invention on the circuit board.

Preferably, the first lead wire has a first portion connected to the first portion of the first lead conductor; the second lead wire has a first portion connected to the first portion of the second lead conductor; and the element body is fitted to the respective first portions of the first lead wire and the second lead wire. In this case, the element body can be securely held by the first lead wire and the second lead wire in a direction intersecting with the facing direction of the first principal face and the second principal face. For this reason, for example, when flow soldering is applied to solder the first portion of the first lead wire to the first portion of the first lead conductor and to solder the first portion of the second lead wire to the first portion of the second lead conductor, the element body becomes less likely to slip off the first lead wire and the second lead wire even if the element body is subject to external force from solder.

More preferably, the first side face and the second side face are of a shape having a projected and/or depressed region; the first portion of the first lead wire is curved in a shape corresponding to the first side face and is engaged with the first side face through the first portion of the first lead conductor; and the first portion of the second lead wire is curved in a shape corresponding to the second side face and is engaged with the second side face through the first portion of the second lead conductor. In this case, it is feasible to surely realize a configuration for fitting the element body to the respective first portions of the first lead wire and the second lead wire.

Preferably, the first lead conductor has a second portion laid on the first principal face so as to electrically connect the first portion of the first lead conductor to the first electrode; the second lead conductor has a second portion laid on the second principal face so as to electrically connect the first portion of the second lead conductor to the second electrode; the electronic component further comprises a first insulating film having at least a portion laid on the first principal face so as to cover the first electrode and the second portion of the first lead conductor, and a portion laid on the second principal face so as to cover the second electrode and the second portion of the second lead conductor. In this case, when the first portion of the first lead wire is soldered to the first portion of the first lead conductor and the first portion of the second lead wire is soldered to the first portion of the second lead conductor, the first insulating film makes it unlikely that solder attaching to the first portions of the first lead conductor and the second lead conductor will flow over the first side face and the second side face onto the first principal face and the second principal face. As a result, it becomes feasible to maintain the flat condition of the region corresponding to the first principal face and the region corresponding to the second principal face in the exterior of the electronic component.

More preferably, the electronic component further comprises a second insulating film being thermally resistant and laid so as to cover the element body, the first insulating film, the first portion of the first lead conductor, the first portion of the second lead conductor, the first portion of the first lead wire, and the first portion of the second lead wire. In this case, contact portions become closely fitted between the second insulating film and the element body and, when the armor is formed so as to further cover the second insulating film, the armor is closely fitted to the second insulating film. For this reason, even if heat is applied from the outside (e.g., when heat is applied during mounting the electronic component onto a circuit board by reflow soldering), the second insulating film becomes unlikely to peel off the element body and the armor becomes unlikely to peel off the second insulating film. As a result, it becomes feasible to ensure satisfactory withstanding voltage performance and to prevent occurrence of migration.

Preferably, the first lead conductor has a second portion laid on the first principal face so as to be drawn out from the first electrode and up to the first portion of the first lead conductor; the second lead conductor has a second portion laid on the second principal face so as to be drawn out from the second electrode and up to the first portion of the second lead conductor; the second portion of the first lead conductor and the second portion of the second lead conductor do not face each other when seen from a facing direction of the first principal face and the second principal face; and a position where the second portion of the second lead conductor is drawn out from the second electrode is set at a maximum direct distance from a position where the second portion of the first lead conductor is drawn out from the first electrode. In this case, the spacing becomes large between the first lead conductor and the second lead conductor. As a result, the dielectric breakdown voltage becomes larger and the withstanding voltage can be improved.

Preferably, the element body has a third side face and a fourth side face extending so as to couple the first principal face and the second principal face to each other, and facing each other; the first lead conductor has a second portion laid on the first principal face so as to be drawn out from the first electrode and up to the first portion of the first lead conductor; the second lead conductor has a second portion laid on the second principal face so as to be drawn out from the second electrode and up to the first portion of the second lead conductor; the second portion of the first lead conductor and the second portion of the second lead conductor do no face each other when seen from a facing direction of the first principal face and the second principal face; the second portion of the first lead portion extends from the first electrode toward the third side face; and the second portion of the second lead portion extends from the second electrode toward the fourth side face. In this case, the spacing becomes much larger between the first lead conductor and the second lead conductor As a result, the dielectric breakdown voltage becomes much greater and the withstanding voltage can be further improved.

Preferably, the element body is provided with a depression and/or a projection in a region between the first electrode and the second side face on the first principal face and in a region between the second electrode and the first side face on the second principal face. In this case, the creeping distance between the first electrode and the first portion of the second lead conductor and the creeping distance between the second electrode and the first portion of the first lead conductor become larger As a result, the dielectric breakdown voltage becomes larger and the withstanding voltage can be improved.

Preferably, the first electrode and the second electrode are of a round shape. If the first electrode and the second electrode have corners, an electric field will be likely to locally concentrate at the corners. When the first electrode and the second electrode are of the round shape, occurrence of the foregoing electric field concentration is suppressed. As a result, the dielectric breakdown voltage becomes larger and the withstanding voltage can be improved.

On the other hand, a mounted structure of an electronic component according to the present invention comprises: the electronic component; and a circuit board in which a first signal electrode and a second signal electrode are formed on a mount surface; wherein the first lead wire of the electronic component is connected to the first signal electrode; wherein the second lead wire of the electronic component is connected to the second signal electrode; and wherein an exterior surface of the armor on the first principal face side is in contact with the circuit board.

An inverter device according to the present invention comprises any one of the electronic components as described above.

The present invention provides the electronic component permitting easy surface mounting onto a circuit board, the mounted structure, and the inverter device therewith.

The present invention will be more fully understood from the detailed description given hereinbelow and the accompanying drawings which are given by way of illustration only, and thus are not to be considered as limiting the present invention.

BRIEF DESCRIPTION OF THE DRAWINGS (a) of FIG. 1 is a perspective view of a surface mount type electronic component of the first embodiment from the principal face side of a dielectric element body, and (b) of FIG. 1 is a perspective view of the surface mount type electronic component of the first embodiment from the side face side of the dielectric element body.

(a) of FIG. 6 is a perspective view of a surface mount type electronic component of the second embodiment from the principal face side of a dielectric element body, and (b) of FIG. 6 is a sectional view along line VIb-VIb in (a) of FIG. 6.

Figure 7:
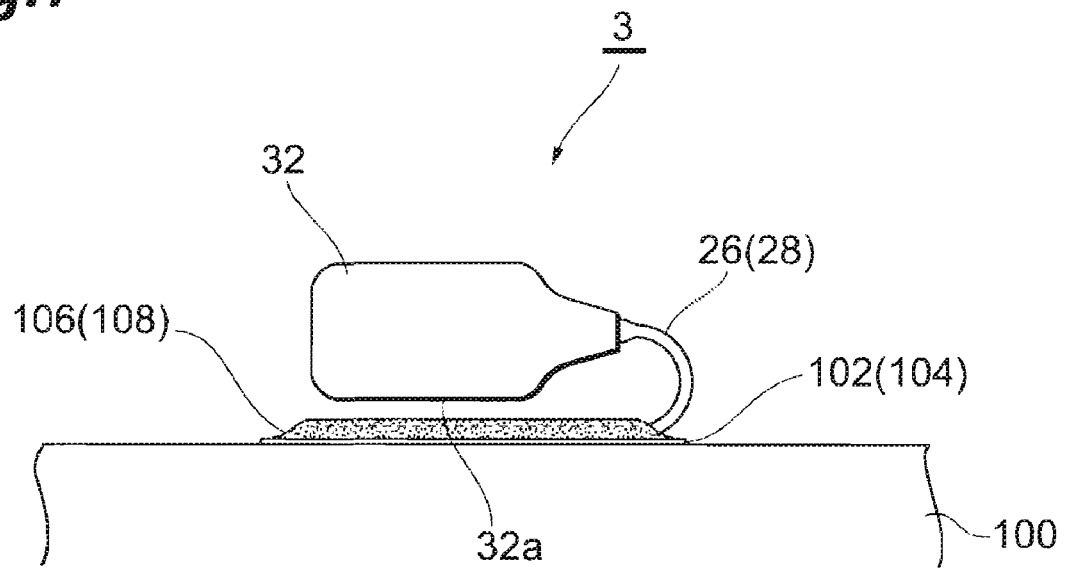

FIG. 7 is a drawing showing a state in which a surface mount type electronic component of the third embodiment is connected to a circuit board.

FIG. 8 is a drawing showing a surface mount type electronic component of the fourth embodiment.

FIG. 9 is a drawing showing a surface mount type electronic component of the fifth embodiment.

DESCRIPTION OF THE PREFERRED EMBODIMENTS

The preferred embodiments of the present invention will be described with reference to the drawings. The same elements or elements with the same functionality will be denoted by the same reference symbols throughout the description, without redundant description.

First Embodiment

Figure 1:
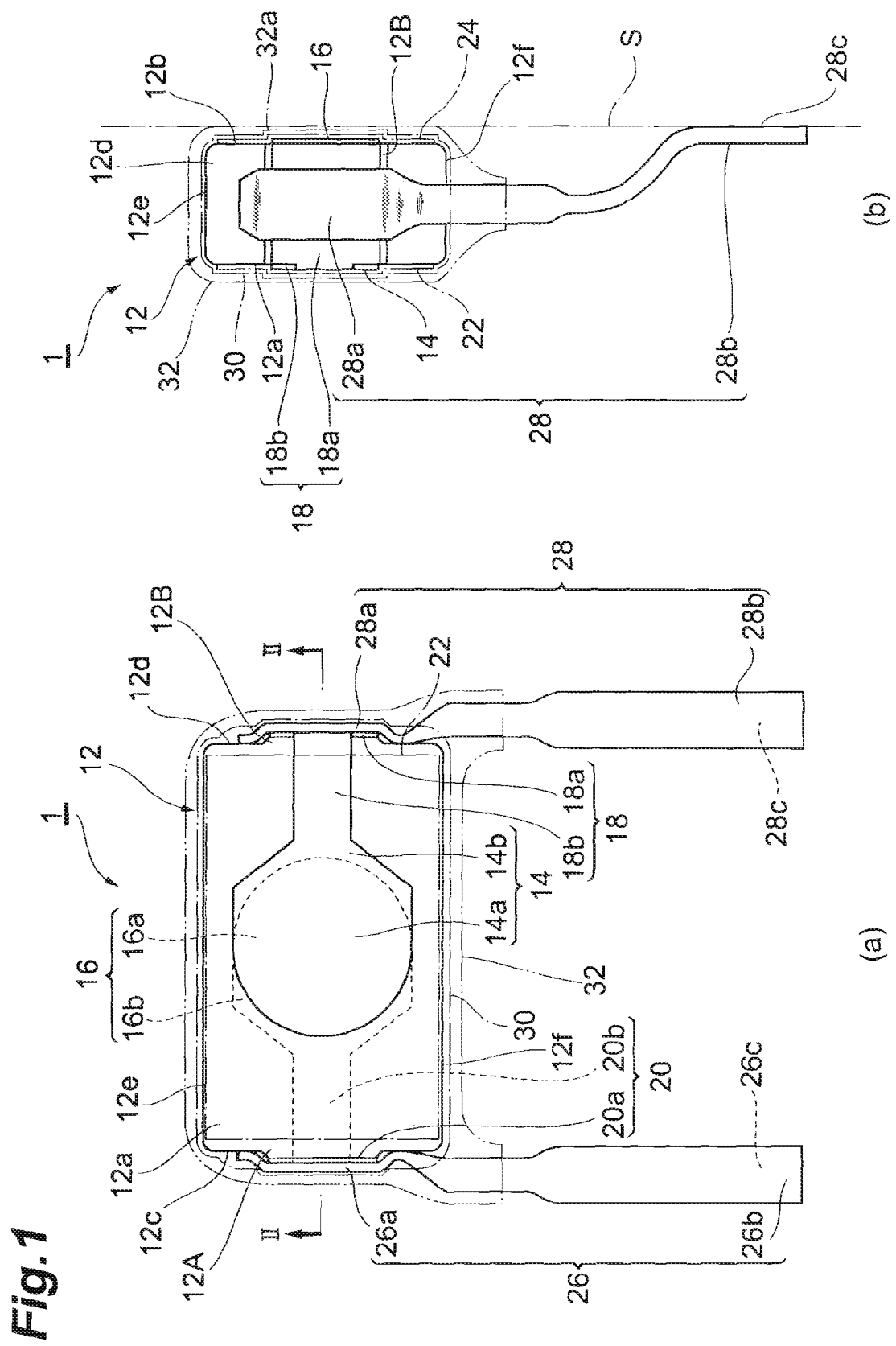
Figure 2:
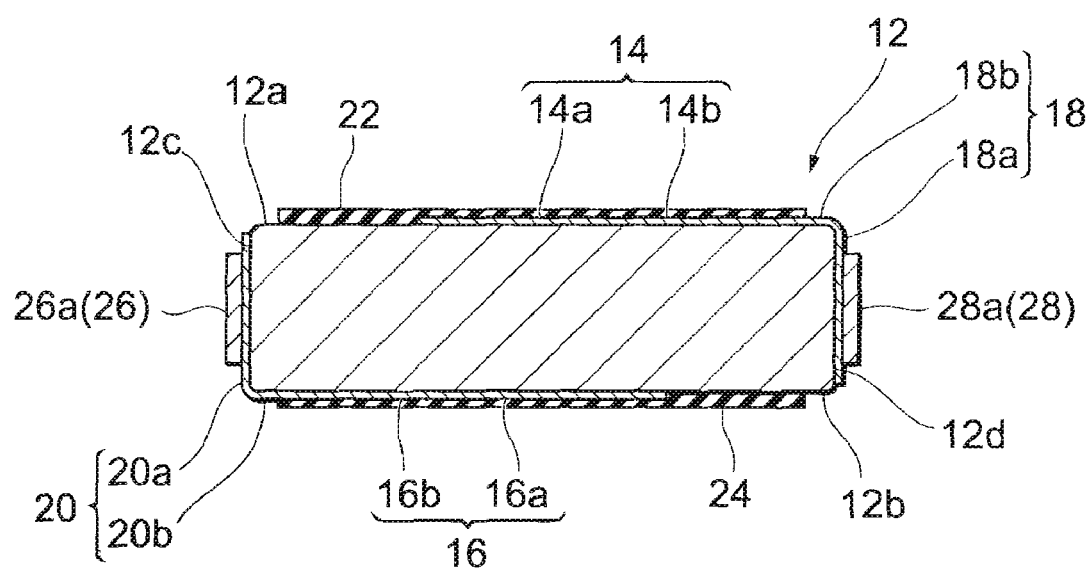
FIG. 2 is a sectional view along line II-II in (a) of FIG. 1.

First, a structure of a surface mount type electronic component 1 according to the first embodiment will be described with reference to FIGS. 1 and 2. (a) of FIG. 1 is a perspective view of the surface mount type electronic component of the first embodiment from the principal face side of a dielectric element body and (b) of FIG. 1 a perspective view of the surface mount type electronic component of the first embodiment from the side face side of the dielectric element body. FIG. 2 is a sectional view along line II-II in (a) of FIG. 1. The surface mount type electronic component 1 of the first embodiment is an application of the present invention to a surface mount type capacitor.

The surface mount type electronic component 1, as shown in FIG. 1, has a dielectric element body (element body with a dielectric property) 12, electrodes 14, 16, lead conductors 18, 20, solder resists 22, 24, a pair of lead wires 26, 28, an undercoat 30, and an armor 32.

The dielectric element body 12, as shown in FIGS. 1 and 2, is of a nearly rectangular parallelepiped shape and has principal faces 12a, 12b facing each other, side faces 12c, 12d facing each other, and side faces 12e, 12f facing each other. The side faces 12c, 12d extend so as to couple the principal Faces 12a, 12b and the side Faces 12e, 12f, and the side faces 12e, 12f extend so as to couple the principal faces 12a, 12b and the side faces 12c, 12d. The dielectric element body 12 can be made of a dielectric ceramic material, e.g., a material obtained by adding a rare-earth element in barium titanate or strontium titanate.

The dielectric element body 12 has a projection 12A projecting outward from the dielectric element body 12 and extending in the facing direction of the principal faces 12a, 12b, on the side face 12c. This makes the side face 12c of a shape having a projecting region. The dielectric element body 12 has a projection 12B projecting outward from the dielectric element body 12 and extending in the facing direction of the principal faces 12a, 12b, on the side face 12d. This makes the side face 12d of a shape having a projecting region.

The electrodes 14, 16 and lead conductors 18, 20 are arranged on the dielectric element body 12. The electrode 14 is laid on the principal face 12a and the electrode 16 on the principal face 12b. The lead conductor 18 is laid on the principal face 12a and on the side face 12d and is electrically connected to the electrode 14. The lead conductor 20 is laid on the principal face 12b and on the side face 12c and is electrically connected to the electrode 16.

The electrode 14 comprises two portions 14a and 14b. The electrode 16 comprises two portions 16a and 16b. The electrodes 14, 16 have their respective portions 14a, 16a overlapping each other in the facing direction of the principal faces 12a, 12b. The capacitance of the surface mount type electronic component 1 as a capacitor is defined by the facing area of the overlap portions 14a, 16a of the electrodes 14, 16 and the spacing between the electrode 14 and the electrode 16 (i.e., the thickness of the dielectric element body 12).

The lead conductor 18 extends so as to be drawn out from a portion near the side face 12d in the electrode 14. The electrode 14 has a portion of a nearly semicircular shape (portion near the side face 12c) on the side opposite to the side where the lead conductor 18 is drawn out, and decreases its width toward the lead conductor 18 in the portion on the side where the lead conductor 18 is drawn out (i.e., in the portion near the side face 12d). In the present embodiment the electrode 14 and the lead conductor 18 are integrally formed.

The lead conductor 20 extends so as to be drawn out from a portion near the side face 12c in the electrode 16. The electrode 16 has a portion of a nearly semicircular shape (portion near the side face 12d) on the side opposite to the side where the lead conductor 20 is drawn out, and decreases its width toward the lead conductor 20 in the portion on the side where the lead conductor 20 is drawn out (i.e., in the portion near the side face 12c). In the present embodiment the electrode 16 and the lead conductor 20 are integrally formed.

The lead conductor 18 has a first portion 18a and a second portion 18b. The first portion 18a is laid on the side face 12d (projection 12B). The first portion 18a extends in the facing direction of the principal faces 12a, 12b. The second portion 18b is laid on the principal face 12a so that it electrically connects the first portion 18a and the electrode 14, i.e., so that it is drawn out from the electrode 14 and up to the first portion 18a. In the present embodiment the first portion 18a and the second portion 18b are integrally formed.

The lead conductor 20 has a first portion 20a and a second portion 20b. The first portion 20a is laid on the side face 12c (projection 12A). The first portion 20a extends in the facing direction of the principal faces 12a, 12b. The second portion 20b is laid on the principal face 12b so that it electrically connects the first portion 20a and the electrode 16, i.e., so that it is drawn out from the electrode 16 and up to the first portion 20a. In the present embodiment the first portion 20a and the second portion 20b are integrally formed.

The respective second portions 18b, 20b of the lead conductors 18, 20 extend in directions opposite to each other with respect to the electrodes 14, 16, and do not face each other when seen from the facing direction of the principal faces 12a, 12b. The position where the second portion 20b of the lead conductor 20 is drawn out from the electrode 16 is set at the maximum direct distance from the position where the second portion 18b of the first lead conductor 18 is drawn out from the electrode 14.

The solder resist 22 is laid on the principal face 12a so as to cover the electrode 14 and the major part of the second portion 18b of the lead conductor 18. The solder resist 24 is laid on the principal face 12b so as to cover the electrode 16 and the major part of the second portion 20b of the lead conductor 20. The solder resists 22, 24 are an insulating material with a heat-resisting property and are provided for preventing adhesion of solder to the electrodes 14, 16 and the second portions 18b, 20b of the lead conductors 18, 20 and for maintaining moisture resistance and insulation.

The lead wire 26 has a first portion 26a and a second portion 26b. The first portion 26a is curved in a shape (nearly like the C-shape) corresponding to the shape of the side face 12c of the dielectric element body 12 (the shape having the projecting region). The first portion 26a is fitted to the dielectric element body 12 and the first portion 26a is engaged with the side face 12c of the dielectric element body 12 through the first portion 20a of the lead conductor 20. The first portion 26a is connected to the first portion 20a of the lead conductor 20 by unrepresented solder. This causes the lead wire 26 to be electrically and physically connected to the lead conductor 20. The first portion 26a is of a flat plate shape, for improvement in a contact area with the lead conductor 20.

The second portion 26b extends in the facing direction of the side faces 12e, 12f from the first portion 26a and away from the dielectric element body 12. The second portion 26b is bent in a direction from the principal face 12a toward the principal face 12b out of the facing directions of the principal faces 12a, 12b when seen from the facing direction of the side faces 12c, 12d. This leads at least part of the second portion 26b (the end of the second portion 26b apart from the first portion 26a in the present embodiment) to be located on a virtual plane S including an outer surface 32a (hereinafter referred to as the outer surface 32a of the armor 32) located on the principal face 12b side among the outer surfaces of the armor 32.

The foregoing end of the second portion 26b is of a flat plate shape or flat shape with a flat surface 26c nearly parallel to the principal faces 12a, 12b, for improvement in a contact area with a signal electrode 102 (cf. FIG. 3) formed on a circuit board 100 which will be described hereinbelow. Therefore, the flat surface 26c of the second portion 26b and the outer surface 32a of the armor 32 are included in the same virtual plane S.

The lead wire 28 has a first portion 28a and a second portion 28b. The first portion 28a is curved in a shape (nearly like the C-shape) corresponding to the shape of the side face 12d of the dielectric element body 12 (the shape having the projecting region). The first portion 28a is fitted to the dielectric element body 12 and the first portion 28a is engaged with the side face 12d of the dielectric element body 12 through the first portion 18a of the lead conductor 18. The first portion 28a is connected to the first portion 18a of the lead conductor 18 by unrepresented solder. This causes the lead wire 28 to be electrically and physically connected to the lead conductor 18. The first portion 28a is of a flat plate shape, for improvement in a contact area with the lead conductor 18.

The second portion 28b extends in the facing direction of the side faces 12e, 12f from the first portion 28a and away from the dielectric element body 12. The second portion 28b is bent in the direction from the principal face 12a toward the principal face 12b out of the facing directions of the principal faces 12a, 12b when seen from the facing direction of the side faces 12c, 12d. This leads at least part of the second portion 28b (the end of the second portion 28b apart from the first portion 28a in the present embodiment) to be located on the virtual plane S including the outer surface 32a of the armor 32.

The foregoing end of the second portion 28b is of a flat plate shape or flat shape with a flat surface 28c nearly parallel to the principal faces 12a, 12b, for improvement in a contact area with a signal electrode 104 (cf. FIG. 3) formed on the below-described circuit board 100. Therefore, the flat surface 28c of the second portion 28b and the outer surface 32a of the armor 32 are included in the same virtual plane S.

The undercoat 30 is laid so as to cover the dielectric element body 12, electrodes 14, 16, lead conductors 18, 20, solder resists 22, 24, the first portion 26a of the lead wire 26, and the first portion 28a of the lead wire 28. The undercoat 30 consists of an insulating material with a heat-resisting property. The armor 32 is laid so as to further cover the dielectric element body 12, electrodes 14, 16, lead conductors 18, 20, solder resists 22, 24, first portion 26a of the lead wire 26, and first portion 28a of the lead wire 28 covered by the undercoat 30. The armor 32 consists of an insulating material with a heat-resisting property.

Figure 3:
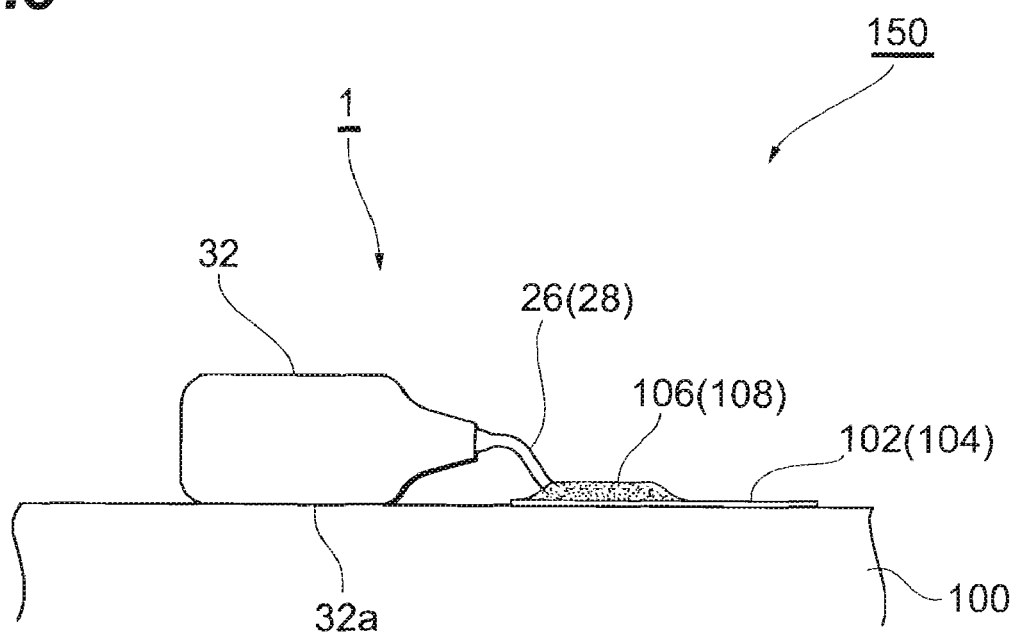
FIG. 3 is a drawing showing a state in which the surface mount type electronic component of the first embodiment is connected to a circuit board.

A mounted structure of the surface mount type electronic component 1 of the above-described configuration and the circuit board 100 will be described below with reference to FIG. 3. FIG. 3 is a drawing showing a state in which the surface mount type electronic component of the first embodiment is connected to the circuit board.

The circuit board 100 is a so-called printed circuit board on a surface of which there are a lot of signal electrodes, ground electrodes, etc. (not shown) wired including the signal electrodes 102, 104, and, together with the surface mount type electronic component 1, constitutes part of an inverter device 150. The surface mount type electronic component 1 is mounted on the circuit board 100 by connecting the second portion 26b of the lead wire 26 to the signal electrode 102 of the circuit board 100 by solder 106 and connecting the second portion 28b of the lead wire 28 to the signal electrode 104 of the circuit board 100 by solder 108. In this connection, when the surface mount type electronic component 1 is mounted onto the circuit board 100, the outer surface 32a of the armor 32 comes into contact with the circuit board 100 because the second portion 26b of the lead wire 26 and the second portion 28b of the lead wire 28 are so bent that the flat surface 26c of the second portion 26b of the lead wire 26, the flat surface 28c of the second portion 28b of the lead wire 28, and the outer surface 32a of the armor 32 are included in the same virtual plane S. The surface mount type electronic component 1 can be soldered to the circuit board 100, for example, by reflow soldering.

Figure 4:
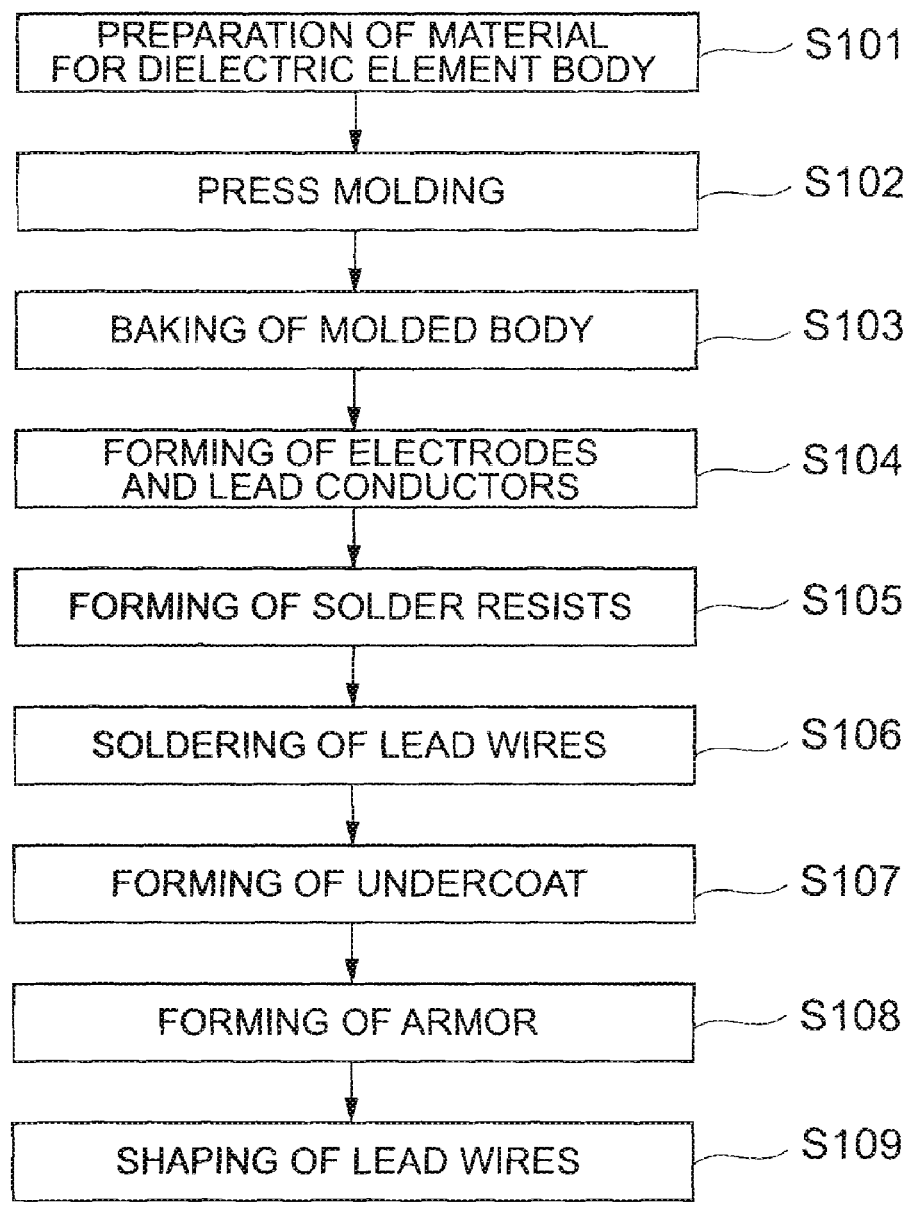
FIG. 4 is a flowchart for explaining a production process of the surface mount type electronic component of the first embodiment.
Figure 5:
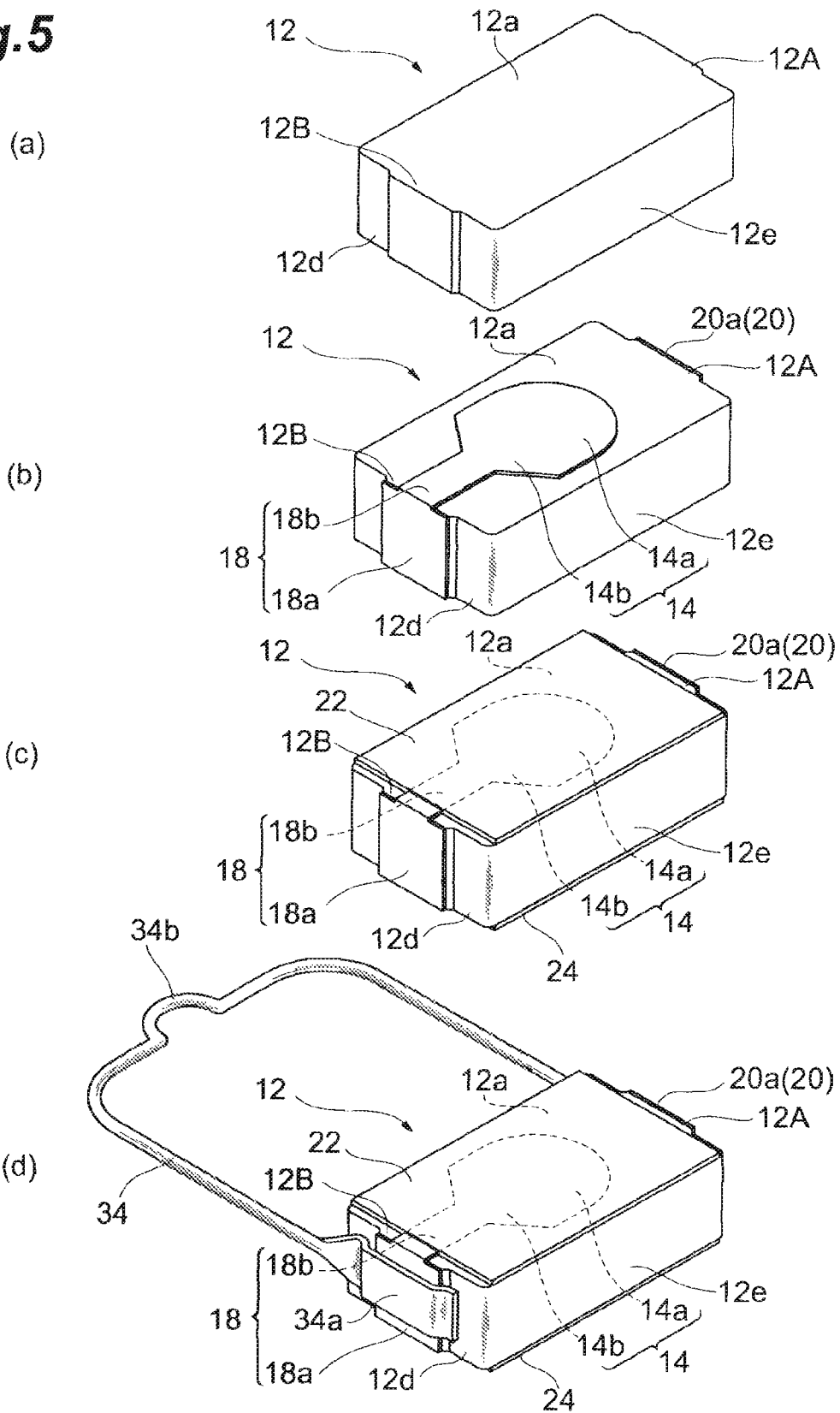
FIG. 5 is a drawing for explaining steps in the production process of the surface mount type electronic component.

A production method of the surface mount type electronic component 1 will be described below with reference to FIGS. 4 and 5. FIG. 4 is a flowchart for explaining a production process of the surface mount type electronic component according to the first embodiment. FIG. 5 is a drawing for explaining steps in the production process of the surface mount type electronic component. It is noted that steps are abbreviated as S in the flowchart shown in FIG. 4.

The first step S101 is to prepare a material for the dielectric element body as a raw material of the dielectric element body 12. Specifically, the material for the dielectric element body is obtained by kneading raw materials containing, for example, major ingredients of Ti, Ba, Sr, Ca, Nd, La, etc. and an additive of another rare-earth element as an accessory ingredient, presintering the resultant mixture at a predetermined temperature, and pulverizing and granulating the raw material after presintering.

The subsequent step S102 is to press-mold the material for the dielectric element body obtained in step S101 in a desired shape. Specifically, the press molding results in obtaining a molded body in a nearly rectangular parallelepiped shape with surfaces for the principal faces 12a, 12b and the side faces 12c-12f and with the projections 12A, 12B, i.e., in the shape in which the side faces 12c, 12d have the aforementioned projecting regions.

The subsequent step S103 is to bake the molded body obtained in step S102 at a predetermined temperature (e.g., about 1100° C.-1500° C.) to obtain the dielectric element body 12 (cf. FIG. 5(a)).

The subsequent step S104 is to form the electrodes 14, 16 and the lead conductors 18, 20 (cf. FIG. 5(b)). In this step, an electroconductive paste for the electrode 16 is first screen-printed on the principal face 12a and an electroconductive paste for the lead conductor 18 is screen-printed so as to extend from the principal face 12a down to the side face 12d. Furthermore, an electroconductive paste for the electrode 16 is screen-printed on the principal face 12b and an electroconductive paste for the lead conductor 20 is screen-printed so as to extend from the principal face 12b down to the side face 12c. Then the screen-printed electroconductive pastes are baked at a predetermined temperature (e.g., about 800° C.). The electroconductive pastes consist of a mixture of an organic binder, an organic solvent, etc. with a metal powder (e.g., Ag, Cu, Ni, or the like). The screen printing of the electroconductive pastes onto the side faces 12d, 12c does not always have to be carried out simultaneously with the screen printing of the electroconductive pastes onto the principal faces 12a, 12b as described above, but may be carried out separately.

The subsequent step S105 is to form the solder resists 22, 24 (cf. FIG. 5(c)). In this step, solder resist pastes for the solder resists 22, 24 are first printed on the principal face 12a and on the principal face 12b so as to cover the electrode 14 and the major part of the second portion 18b of the lead conductor 18 and cover the electrode 16 and the major part of the second portion 20b of the lead conductor 20. Then the printed solder resist pastes are heated (or cured) at a predetermined temperature (e.g., about 100° C.-160° C.). An epoxy paste, a phenolic resin, or the like is used for the solder resist pastes.

The subsequent step S106, as shown in FIG. 5(d), is to solder and fix a lead wire member 34 for the lead wires 26, 28, to the lead conductors 18, 20. In this step, the dielectric element body 12 with the solder resists 22, 24 is pinched by the lead wire member 34 for the lead wires 26, 28 and the lead wire member 34 is soldered to the first portion 18a of the lead conductor 18 and to the first portion 20a of the lead conductor 20, for example, by flow soldering. The two ends 34a of the lead wire member 34 each are of a flat plate shape for improvement in a contact area with the lead conductors 18, 20 and are curved in the shape corresponding to the side face 12c and the side face 12d. The central part 34b of the lead wire member 34 is curved in a nearly semicircular arch shape so as to be able to pinch the dielectric element body 12 by press force in directions in which the two ends 34a approach each other.

The subsequent step S107 is to form the undercoat 30 (cf. FIG. 1). In this step, an undercoat material for the undercoat 30 is first applied so as to cover the dielectric element body 12, electrodes 14, 16, lead conductors 18, 20, solder resists 22, 24, and two ends 34a of the lead wire member 34. Then the applied undercoat material is baked at a predetermined temperature (e.g., about 110° C.-160° C.). The undercoat material can be, for example, an epoxy-phenol resin or varnish.

The subsequent step S108 is to form the armor 32 (cf. FIG. 1). In this step, an armor material for the armor 32 is first applied so as to further cover the dielectric element body 12, electrodes 14, 16, lead conductors 18, 20, solder resists 22, 24, and two ends 34a of the lead wire member 34 covered by the undercoat 30. Then the applied armor material is baked at a predetermined temperature (e.g., about 130° C.-170° C.). This armor material can be, for example, an epoxy powder paint.

The subsequent step S109 is to shape a pair of lead wires 26, 28. In this step, the central part 34b of the lead wire member 34 is cut to form the pair of lead wires 26, 28. Then the lead wires 26, 28 are shaped by press machining so as to shape the second portions 26b, 28b of the lead wires 26, 28 into the flat plate shape with the flat surfaces 26c, 28c and to bend them toward the principal face 12b of the dielectric element body 12. At this time, the lead wires are pressed so that the flat surfaces 26c, 28c and the outer surface 32a of the armor 32 are included in the same virtual plane S. The surface mount type electronic component 1 is produced through the above steps.

In the first embodiment, as described above, the electrode 14 is laid on the principal face 12a, the electrode 16 on the principal face 12b, the first portion 18a of the lead conductor 18 on the side face 12d, and the first portion 20a of the lead conductor 20 on the side face 12c. In the first embodiment, the first portion 26a of the lead wire 26 is connected to the first portion 20a of the lead conductor 20 and the first portion 28a of the lead wire 28 is connected to the first portion 18a of the lead conductor 18. For this reason, the lead wires 26, 28 are not present on the principal face 12a, 12b sides of the dielectric element body 12 and the regions corresponding to the principal faces 12a, 12b in the outer surfaces of the surface mount type electronic component 1 (armor 32) are relatively flat. As a result, the surface mount type electronic component 1 can be surface-mounted by means of the conventional electronic component mounting apparatus, which permits the surface mount type electronic component 1 to be readily surface-mounted onto the circuit board 100.

In the first embodiment, the ends (flat surface 26c) of the respective second portions 26b, 28b of the lead wires 26, 28 are located on the virtual plane S including the outer surface 32a of the armor 32. For this reason, when the surface mount type electronic component 1 is mounted on the circuit board 100, the outer surface 32a of the armor 32 and part of the second portions 26b, 28b of the lead wires 26, 28 come into contact with the circuit board 100. As a consequence, no unsteadiness occurs during mounting the surface mount type electronic component 1 onto the circuit board 100, whereby the electronic component can be mounted at any desired position on the circuit board 100 and the surface mount type electronic component 1 can be securely surface-mounted.

In the first embodiment, the ends of the second portions 26b, 28b of the lead wires 26, 28 are of the flat plate shape with the flat surfaces 26c, 28c. For this reason, the contact area increases between part of the second portions 26b, 28b of the lead wires 26, 28 and the circuit board 100, when compared with that in the case where the ends of the second portions 26b, 28b are not of the flat plate shape (e.g., a case where they are of a round rod shape). As a result, it becomes feasible to increase the bond strength between the lead wires 26, 28 and the circuit board 100 when the lead wires 26, 28 are soldered to the signal electrodes 102, 104 of the circuit board 100.

In the first embodiment, the dielectric element body 12 is fitted to the respective first portions 26a, 28a of the lead wires 26, 28. For this reason, the dielectric element body 12 can be securely held by the lead wires 26, 28 in directions intersecting with the facing direction of the principal faces 12a, 12b. As a consequence, the dielectric element body 12 is unlikely to slip off the lead wires 26, 28 even if an external force from solder is exerted on the dielectric element body 12 during soldering the first portion 26a of the lead wire 26 to the first portion 20a of the lead conductor 20 and soldering the first portion 28a of the lead wire 28 to the first portion 18a of the lead conductor 18, for example, by flow soldering.

In the first embodiment, the side faces 12c, 12d are of the shape having the projecting region. The first portion 26a of the lead wire 26 is curved in the shape corresponding to the side face 12c and is engaged with the side face 12c. The first portion 28a of the lead wire 28 is curved in the shape corresponding to the side face 12d and is engaged with the side face 12d. This can surely realize the configuration for fitting the dielectric element body 12 to the respective first portions 26a, 28a of the lead wires 26, 28.

In the first embodiment the surface mount type electronic component 1 is provided with the solder resists 22, 24. For this reason, the solder resists 22, 24 makes it unlikely that solder adhering to the first portion 18a of the lead conductor 18 and the first portion 20a of the lead conductor 20 will flow from the side face 12c, 12d sides onto the principal faces 12a, 12b, during soldering the first portion 26a of the lead wire 26 to the first portion 20a of the lead conductor 20 and soldering the first portion 28a of the lead wire 28 to the first portion 18a of the lead conductor 18. As a consequence, the regions corresponding to the principal faces 12a, 12b can be maintained flat among the outside surfaces of the surface mount type electronic component 1 (armor 32).

In the first embodiment the surface mount type electronic component 1 is provided with the undercoat 30. For this reason, the undercoat 30 and the dielectric element body 12 are closely fitted to each other in their contact portions and the armor 32 formed to further cover the undercoat 30 is closely fitted to the undercoat 30; therefore, the undercoat 30 becomes unlikely to peel off the dielectric element body 12 and the armor 32 becomes unlikely to peel off the undercoat 30. As a consequence, it becomes feasible to ensure the withstanding voltage performance and to prevent occurrence of migration.

In the first embodiment, the second portion 18b of the lead conductor 18 and the second portion 20b of the lead conductor 20 do not face each other when seen from the facing direction of the principal faces 12a, 12b. The position where the second portion 20b of the lead conductor 20 is drawn out from the electrode 16 is set at the maximum direct distance from the position where the second portion 18b of the lead conductor 18 is drawn out from the electrode 14. For this reason, the spacing is large between the lead conductor 18 and the lead conductor 20. As a consequence, the dielectric breakdown voltage becomes larger and the withstanding voltage can be improved.

In the first embodiment, the electrode 14 is of the nearly semicircular shape on the side opposite to the side where the electrode 14 is integrally formed with the lead conductor 18, and the electrode 16 is of the nearly semicircular shape on the side opposite to the side where the electrode 16 is integrally formed with the lead conductor 20. The electrodes 14, 16 are thus of the round shape. For this reason, the electric field concentration is suppressed, to increase the dielectric breakdown voltage, whereby the withstanding voltage can be improved.

Second Embodiment

The surface mount type electronic component 2 according to the second embodiment will be described below with reference to FIG. 6. (a) of FIG. 6 is a perspective view of the surface mount type electronic component of the second embodiment from the principal face side of the dielectric element body and (b) of FIG. 6 a sectional view along line VIb-VIb in (a) of FIG. 6. The surface mount type electronic component 2 of the second embodiment will be described below with focus on differences from the surface mount type electronic component 1 of the first embodiment, without redundant description.

The surface mount type electronic component 2, as shown in FIG. 6, has a dielectric element body 12, electrodes 14, 16, lead conductors 18, 20, solder resists 22, 24, a pair of lead wires 26, 28, an undercoat 30, and an armor 32.

The dielectric element body 12 has principal faces 12a, 12b facing each other, side faces 12c, 12d facing each other, and side faces 12e, 12f facing each other. The dielectric element body 12 has a projection 12A projecting outward from the dielectric element body 12 and extending in the facing direction of the principal faces 12a, 12b, on the side face 12c. The dielectric element body 12 has a projection 12B projecting outward from the dielectric element body 12 and extending in the facing direction of the principal faces 12a, 12b, on the side face 12d.

The dielectric element body 12 has a pair of grooves 40A, 40B extending in the facing direction of the side faces 12e, 12f on the principal face 12a side. The dielectric element body 12 has a pair of grooves 40C, 40D extending in the facing direction of the side faces 12e, 12f on the principal face 12b side.

The electrodes 14, 16 and lead conductors 18, 20 are laid on the dielectric element body 12. The electrode 14 is laid on the principal face 12a and the electrode 16 on the principal face 12b. The lead conductor 18 is laid on the principal face 12a and on the side face 12d and is electrically connected to the electrode 14. The lead conductor 20 is laid on the principal face 12b and on the side face 12c and is electrically connected to the electrode 16.

The electrode 14 is of a nearly circular shape and is located between the grooves 40A, 40B. The electrode 16 is of a nearly circular shape and is located between the grooves 40C, 40D. The electrodes 14, 16 overlap each other when seen from the facing direction of the principal faces 12a, 12b. The lead conductor 18 extends so as to be drawn out from the electrode 14 (the portion near the side face 12f in the electrode 14). The lead conductor 20 extends so as to be drawn out from the electrode 16 (the portion near the side face 12e in the electrode 16). The position where the lead conductor 18 is drawn out from the electrode 14 and the position where the lead conductor 20 is drawn out from the electrode 16 are set opposite to each other with respect to the center of the electrodes 14, 16 when seen from the facing direction of the electrodes 14, 16. In the present embodiment, each of the electrodes 14, 16 is formed integrally with the corresponding lead conductor 18 or 20.

The lead conductor 18 has a first portion 18a and second portion 18b-18e. The first portion 18a is laid on the side face 12d (projection 12B). The first portion 18a extends in the facing direction of the principal faces 12a, 12b. The second portion 18b-18e is laid on the principal face 12a so as to electrically connect the first portion 18a to the electrode 14. In the present embodiment the first and second portions 18a-18e are integrally formed.

The second portion 18b is corrected at one end thereof to the electrode 14 and extends from the electrode 14 toward the side face 12f. The second portion 18c is connected at one end thereof to the other end of the second portion 18b and extends from the other end of the second portion 18b toward the side face 12d so as to be nearly parallel to the side faces 12e, 12f. The second portion 18d is connected at one end thereof to the other end of the second portion 18c and extends from the other end of the second portion 18c toward the projection 12B. The second portion 18e is connected at one end thereof to the other end of the second portion 18d and extends from the other end of the second portion 18d toward the projection 12B so as to be nearly parallel to the side faces 12e, 12f. The first portion 18a is connected at one end thereof to the other end of the second portion 18e. Namely, the lead conductor 18 is arranged to run around the groove 40B and from the principal face 12a onto the side face 12d.

The lead conductor 20 has a first portion 20a and second portion 20b-20e. The first portion 20a is laid on the side face 12c (projection 12A). The first portion 20a extends in the facing direction of the principal faces 12a, 12b. The second portion 20b-20e is laid on the principal face 12b so as to electrically connect the first portion 20a to the electrode 16. In the present embodiment the first and second portions 20a-20e are integrally formed.

The second portion 20b is connected at one end thereof to the electrode 16 and extends from the electrode 16 toward the side face 12e. The second portion 20c is connected at one end thereof to the other end of the second portion 20b and extends from the other end of the second portion 20b toward the side face 12c so as to be nearly parallel to the side faces 12e, 12f. The second portion 20d is connected at one end thereof to the other end of the second portion 20c and extends from the other end of the second portion 20c toward the projection 12A. The second portion 20e is connected at one end thereof to the other end of the second portion 20d and extends from the other end of the second portion 20d toward the projection 12A so as to be nearly parallel to the side faces 12e, 12f. The first portion 20a is connected at one end thereof to the other end of the second portion 20e. Namely, the lead conductor 20 is arranged to run around the groove 40C and from the principal face 12b onto the side face 12c.

The first portion 26a of the lead wire 26 is electrically and physically connected to the first portion 20a of the lead conductor 20 by unrepresented solder. The first portion 28a of the lead wire 28 is electrically and physically connected to the first portion 18a of the lead conductor 18 by unrepresented solder.

The solder resist 22 is laid to cover the electrode 14 and the second portion 18b-18d of the lead conductor 18. The solder resist 24 is laid to cover the electrode 16 and the second portion 20b-20d of the lead conductor 20. The undercoat 30 is laid to cover the dielectric element body 12, electrodes 14, 16, lead conductors 18, 20, solder resists 12, 24, first portion 26a of the lead wire 26, and first portion 28a of the lead wire 28.

In the second embodiment, as described above, the electrode 14 is laid on the principal face 12a, the electrode 16 on the principal face 12b, the first portion 18a of the lead conductor 18 on the side face 12d, and the first portion 20a of the lead conductor 20 on the side face 12c. In the second embodiment, the first portion 26a of the lead wire 26 is connected to the first portion 20a of the lead conductor 20 and the first portion 28a of the lead wire 28 is connected to the first portion 18a of the lead conductor 18. For this reason, the lead wires 26, 28 are not present on the principal face 12a, 12b sides of the dielectric element body 12 and the regions corresponding to the principal faces 12a, 12b in the outer surfaces of the surface mount type electronic component 2 (armor 32) are relatively flat. As a consequence, the surface mount type electronic component 2 can be surface-mounted by means of the conventional electronic component mounting apparatus, whereby the surface mount type electronic component 2 can be readily surface-mounted on the circuit board 100.

In the second embodiment, the position where the lead conductor 18 is drawn out from the electrode 14 and the position where the lead conductor 20 is drawn out from the electrode 16 are set opposite to each other with respect to the center of the electrodes 14, 16 when seen from the racing direction of the electrodes 14, 16. The lead conductor 18 is arranged to run around the groove 40B and from the principal face 12a onto the side face 12c and the lead conductor 20 is arranged to run around the groove 40C and from the principal face 12b onto the side face 12c. For this reason, the spacing is large between the lead conductor 18 and the lead conductor 20. As a consequence, the dielectric breakdown voltage becomes larger and the withstanding voltage can be improved.

In the second embodiment, the electrode 14 of the nearly circular shape is laid on the principal face 12a so as to be located between the grooves 40A, 40B and the electrode 16 of the nearly circular shape is laid on the principal face 12b so as to be located between the grooves 40C, 40D. Namely, the groove 40A is located between the electrode 14 and the side face 12c and the groove 40D is located between the electrode 16 and the side face 12d. For this reason, the creeping distance becomes larger between the electrode 14 and the portion of the lead conductor 20 formed on the side face 12c and the creeping distance becomes larger between the electrode 16 and the portion of the lead conductor 18 formed on the side face 12d. As a consequence, the dielectric breakdown voltage becomes larger and the withstanding voltage can be improved.

In the second embodiment the electrodes 14, 16 are of the nearly circular shape. For this reason, the electric field concentration is suppressed, so as to increase the dielectric breakdown voltage, and the withstanding voltage can be improved.

The above described the preferred embodiments of the present invention in detail, but the present invention is by no means limited to the above-described embodiments. For example, like the surface mount type electronic component 3 shown in FIG. 7, the second portions 26b, 28b of the lead wires 26, 28 may be bent toward the first portions 26a, 28a. This structure decreases the mount area of the surface mount type electronic component 3. As a result, it becomes feasible to increase the mount density of various electronic components including the surface mount type electronic component 3 on the circuit board 100.

Configurations for fitting the dielectric element body 12 to the first portions 26a, 28a of the lead wires 26, 28 are not limited to the configurations presented in the first and second embodiments. For example, like the surface mount type electronic component 4 shown in FIG. 8, the first portion 26a of the lead wire 26 may be engaged with the side face 12c of the dielectric element body 12 through the first portion 20a of the lead conductor 20 and the first portion 28a of the lead wire 28 may be engaged with the side face 12d of the dielectric element body 12 through the first portion 18a of the lead conductor 18. Namely, the dielectric element body 12 has a depression 42A depressed inward into the dielectric element body 12 and extending in the facing direction of the principal faces 12a, 12b, in the side face 12c. This makes the side face 12c of a shape having a depressed region. The dielectric element body 12 also has a depression 42B depressed inward into the dielectric element body 12 and extending in the facing direction of the principal faces 12a, 12b, in the side face 12d. This makes the side face 12d of a shape having a depressed region. The first portion 26a of the lead wire 26 is curved in a shape (nearly like the C-shape) corresponding to the side face 12c. The first portion 28a of the lead wire 28 is curved in a shape (nearly like the C-shape) corresponding to the side face 12d.

Furthermore, like the surface mount type electronic component 5 shown in FIG. 9, the first portion 26a of the lead wire 26 may be engaged with the side face 12c of the dielectric element body 12 through the first portion 20a of the lead conductor 20 and the first portion 28a of the lead wire 28 may be engaged with the side face 12d of the dielectric element body 12 through the first portion 18a of the lead conductor 18. Namely, the dielectric element body 12 has a groove 52A depressed in a nearly cylindrical shape inward into the dielectric element body 12 and extending in the facing direction of the side faces 12e, 12f, in the side face 12c. This makes the side face 12c of a shape having a depressed region. The dielectric element body 12 has a groove 52B depressed in a nearly cylindrical shape inward into the dielectric element body 12 and extending in the facing direction of the side faces 12e, 12f, in the side face 12d. This makes the side face 12d of a shape having a depressed region. The first portion 26a of the lead wire 26 is of a shape (nearly round rod shape) corresponding to the inner surface of the groove 52A. The first portion 28a of the lead wire 28 is of a shape (nearly round rod shape) corresponding to the inner surface of the groove 52B.

In the second embodiment, the second portion 18c of the lead conductor 18 is nearly parallel to the side faces 12e, 12f and, the second portion 20c of the lead conductor 20 is nearly parallel to the side faces 12e, 12f, but the present invention is not limited to this. There are no particular restrictions on the shape of the lead conductors 18, 20 as long as the lead conductor 18 is formed from the electrode 14 toward the side face 12d so as to run around the groove 40B and the lead conductor 20 is formed from the electrode 16 toward the side face 12c so as to run around the groove 40C.

In the second embodiment the dielectric element body 12 has the grooves 40A-40D, but, without having to be limited to this, the dielectric element body may have projections or a combination of projections with grooves.

The first and second embodiments were the applications of the present invention to the surface mount type capacitors, but the present invention may also be applied to a surface mount type varistor. In this case, the surface mount type varistor has a varistor element body instead of the dielectric element body 12. The varistor element body has a dielectric property and a nonlinear current-voltage characteristic (varistor characteristic) and consists of a varistor material (containing ZnO as a major ingredient and a rare-earth element or Bi or the like as an accessory ingredient).

The first and second embodiments adopted the configuration wherein the solder resist 22 was laid on the principal face 12a of the dielectric element body 12 and the solder resist 24 on the principal face 12b of the dielectric element body 12, but the present invention is not limited to this configuration. Namely, it is also possible to adopt a configuration wherein a single solder resist is laid around the entire exterior of the dielectric element body 12 as long as it has a portion laid on the principal face 12a so as to cover the electrode 14 and the major part of the second portion 18b of the lead conductor 18 and a portion laid on the principal face 12b so as to cover the electrode 16 and the major part of the second portion 20b of the lead conductor 20. The solder resists 22, 24 may also be arranged so as not to be laid on the principal faces 12a, 12b.

It is apparent that various embodiments and modifications of the present invention can be embodied, based on the above description. Accordingly, it is possible to carry out the present invention in the other modes than the above best mode, within the following scope of claims and the scope of equivalents.

What is claimed is:

1. An electronic component comprising:
    an element body with a dielectric property having a first principal face and a second principal face facing each other, and a first side face and a second side face extending so as to couple the first principal face and the second principal face to each other, and facing each other;
    a first electrode laid on the first principal face of the element body;
    a second electrode laid on the second principal face of the element body and facing the first electrode;
    a first lead conductor electrically connected to the first electrode;
    a second lead conductor electrically connected to the second electrode;
    a first lead wire electrically connected to the first lead conductor; and
    a second lead wire electrically connected to the second lead conductor;
    wherein the first lead conductor has a first portion laid on the first side face, and said first portion is connected to the first lead wire to be electrically connected to the first lead wire;
    wherein the second lead conductor has a first portion laid on the second side face, and said first portion is connected to the second lead wire to be electrically connected to the second lead wire;
    wherein the element body has a third side face and a fourth side face extending so as to couple the first principal face and the second principal face to each other, and facing each other;
    wherein the first lead conductor has a second portion laid on the first principal face so as to be drawn out from the first electrode and up to the first portion of the first lead conductor;

wherein the second lead conductor has a second portion laid on the second principal face so as to be drawn out from the second electrode and up to the first portion of the second lead conductor;

wherein the second portion of the first lead conductor and the second portion of the second lead conductor do not face each other when seen from a facing direction of the first principal face and the second principal face;

wherein the second portion of the first lead portion extends from the first electrode toward the third side face; and wherein the second portion of the second lead portion extends from the second electrode toward the fourth side face.

2. An inverter device comprising the electronic component as set forth in claim 1.

* * * * *